United States Patent
Rahman

(10) Patent No.: US 8,299,590 B2
(45) Date of Patent: Oct. 30, 2012

(54) SEMICONDUCTOR ASSEMBLY HAVING REDUCED THERMAL SPREADING RESISTANCE AND METHODS OF MAKING SAME

(75) Inventor: Arifur Rahman, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 639 days.

(21) Appl. No.: 12/043,115

(22) Filed: Mar. 5, 2008

(65) Prior Publication Data

US 2009/0224400 A1    Sep. 10, 2009

(51) Int. Cl.
*H01L 23/02* (2006.01)
(52) U.S. Cl. .......... 257/686; 257/E25.006; 257/E25.013
(58) Field of Classification Search .......... 257/E23.193, 257/686, E23.006
See application file for complete search history.

(56) References Cited

U.S. PATENT DOCUMENTS

| | | | |
|---|---|---|---|
| 6,610,560 B2 | 8/2003 | Pu et al. | |
| 6,812,066 B2 * | 11/2004 | Taniguchi et al. | 438/121 |
| 6,930,378 B1 * | 8/2005 | St. Amand et al. | 257/686 |
| 7,068,072 B2 | 6/2006 | New et al. | |
| 7,429,792 B2 * | 9/2008 | Lee et al. | 257/712 |
| 7,514,775 B2 * | 4/2009 | Chao et al. | 257/686 |
| 2002/0167079 A1 | 11/2002 | Pu et al. | |
| 2004/0145051 A1 * | 7/2004 | Klein et al. | 257/734 |
| 2004/0164390 A1 | 8/2004 | Wang | |
| 2004/0238857 A1 | 12/2004 | Beroz et al. | |
| 2004/0251531 A1 | 12/2004 | Yang et al. | |
| 2005/0174738 A1 * | 8/2005 | Lam et al. | 361/704 |
| 2006/0113663 A1 | 6/2006 | Yuan et al. | |
| 2008/0083975 A1 | 4/2008 | Chao et al. | |

FOREIGN PATENT DOCUMENTS

| | | |
|---|---|---|
| JP | 07-235633 | 9/1995 |
| JP | 2001-506417 | 5/2001 |
| JP | 2001-094038 | 6/2001 |
| JP | 2006-269625 | 5/2006 |
| JP | 2006-332366 | 12/2006 |
| WO | WO 98/27587 | 6/1998 |
| WO | WO 2004/107439 A1 | 12/2004 |
| WO | WO 2005/059995 A2 | 6/2005 |

OTHER PUBLICATIONS

U.S. Appl. No. 11/973,062, filed Oct. 4, 2007, Rahman, Arifur et al., entitled "Integrated Circuit with Through-Die Via Interface for Die Stacking", Xilinx, Inc. 2100 Logic Drive, San Jose, CA 95124.
U.S. Appl. No. 12/041,612, filed Mar. 3, 2008, Rahman, Arifur et al., entitled "Apparatus for Interconnecting Stacked Dice on a Programmable Integrated Circuit", Xilinx, Inc. 2100 Logic Drive, San Jose, CA 95124.
U.S. Appl. No. 12/043,843, filed Mar. 6, 2008, Arifur Rahman et al., Xilinx, Inc. 2100 Logic Drive, San Jose, CA 95124.

* cited by examiner

*Primary Examiner* — Steven Loke
*Assistant Examiner* — Kimberly M Thomas
(74) *Attorney, Agent, or Firm* — Robert M. Brush; John J. King

(57) ABSTRACT

Semiconductor assemblies having reduced thermal spreading resistance and methods of making the same are described. In an example, a semiconductor device includes a primary integrated circuit (IC) die and at least one secondary IC die mounted on the primary IC die. A heat extraction element includes a base mounted to the semiconductor device such that each of the at least one secondary IC die is between the primary IC die and the heat extraction element. At least one dummy fill is adjacent the at least one secondary IC die, and each thermally couples the primary IC die to the heat extraction element.

20 Claims, 2 Drawing Sheets

SEMICONDUCTOR ASSEMBLY HAVING REDUCED THERMAL SPREADING RESISTANCE AND METHODS OF MAKING SAME

FIELD OF THE INVENTION

One or more aspects of the present invention relate generally to semiconductor devices and, more particularly, to a semiconductor assembly having reduced thermal spreading resistance and methods of making the same.

BACKGROUND

As semiconductor technology has advanced, the amount and speed of logic available on an integrated circuit (IC) has increased. As a result, ICs are consuming more power. The more power that is consumed, however, the greater the heat that is generated. Conventionally, ICs include devices such as heat sinks to absorb and dissipate heat. A heat sink is an article that absorbs and dissipates heat from an IC using thermal contact. For conventional ICs, heat sinks are thermally coupled to the face side of the die. For flip-chip mounted ICs, heat sinks are thermally coupled to the backside of the die. Heat sinks are typically attached to ICs using a thermal paste. The term "face side" denotes the side of an IC die that receives the bulk of semiconductor processing such that circuitry and interconnect are fabricated on that face side. The backside is opposite the face side of the die.

For a flip-chip IC, for example, the primary heat removal path is through the backside of the die, where a heat sink is attached. Heat is dissipated through several mechanisms, including: (1) vertical heat conduction to the backside of the die and to the heat sink; (2) vertical heat conduction through the die, as well as lateral heat conduction within the base of the heat sink and thermal paste (i.e., heat spreading); and (3) heat convection to the ambient environment. Lateral heat conduction in item (2) depends strongly on the ratio between die area and heat sink base area. When estimating the thermal resistance of a flip-chip package with a heat sink, engineers must account for the spreading resistance (a thermal resistance). The higher the ratio between heat sink base area and die area, the higher the spreading resistance.

The increase in the speed and amount of logic on an IC has outpaced the number and performance of input/output (I/O) connections. As a result, IC die stacking techniques have received renewed interest to address the interconnection bottleneck of high-performance systems. In stacked IC applications, two or more ICs are stacked vertically and interconnections are made between them. One approach to IC stacking involves mounting a second die on the backside of a first die. The stacked IC arrangement is then flip-chip mounted/packaged. A heat sink is then attached to the stacked die or dice.

When a die or dice are stacked on the backside of an IC, the thermal design of the IC may be compromised. For example, if stacked IC dice occupy a total area smaller than the area of the primary IC, there are additional components to spreading resistance. One such component is due to the interface between the primary IC die and the stacked die or dice. Another such component is due to the interface between the stacked die or dice and the heat sink. These additional spreading resistance components lead to poor thermal design and higher junction-to-package thermal resistance. Accordingly, there exists a need in the art for a semiconductor assembly having reduced thermal spreading resistance and methods of making the same.

SUMMARY

An aspect of the invention relates to a semiconductor device. A first integrated circuit (IC) die includes a first surface. At least one additional IC die each includes a top surface and a bottom surface. The bottom surface of each of the at least one additional IC die is mounted to the first surface of the first IC die. At least one dummy fill each includes a top surface and a bottom surface. The bottom surface of each of the at least one dummy fill is mounted to the first surface of the first IC die adjacent the at least one additional IC die. A mounting surface is configured for thermal contact with a heat extraction element. The mounting surface includes the top surface of each of the at least one additional IC die and the at least one dummy fill.

Another aspect of the invention relates to a method of fabricating a semiconductor assembly. A first integrated circuit (IC) die having a first surface is fabricated. At least one additional IC die each having a top surface and a bottom surface is fabricated. The bottom surface of each of the at least one additional IC die is mounted to the first surface of the first IC die. At least one dummy fill each having a top surface and a bottom surface is fabricated. The bottom surface of each of the at least one dummy fill is mounted to the first surface of the first IC die adjacent the at least one additional IC die. A heat extraction element is mounted to the top surface of each of the at least one additional IC die and the at least one dummy fill.

Another aspect of the invention is related to a semiconductor assembly. A semiconductor device includes a primary integrated circuit (IC) die and at least one secondary IC die mounted on the primary IC die. A heat extraction element includes a base mounted to the semiconductor device such that each of the at least one secondary IC die is between the primary IC die and the heat extraction element. At least one dummy fill is adjacent to at least one secondary IC die and each thermally couples the primary IC die to the heat extraction element.

BRIEF DESCRIPTION OF THE DRAWINGS

Accompanying drawings show exemplary embodiments in accordance with one or more aspects of the invention; however, the accompanying drawings should not be taken to limit the invention to the embodiments shown, but are for explanation and understanding only.

DETAILED DESCRIPTION OF THE DRAWINGS

Figure 1:
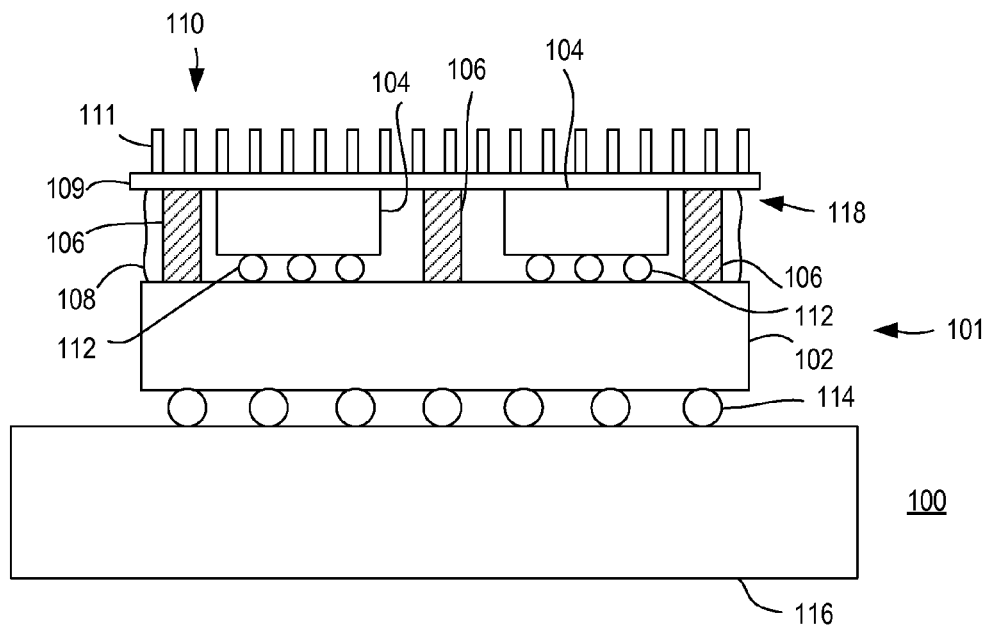
FIG. 1 is a cross-sectional view showing an exemplary embodiment of a semiconductor assembly in accordance with one or more aspects of the invention.

FIG. 1 is a cross-sectional view showing an exemplary embodiment of a semiconductor assembly 100 in accordance with one or more aspects of the invention. The semiconductor assembly 100 includes a semiconductor device 101, a heat extraction element 110, and a package substrate 116. The semiconductor device 101 includes a primary integrated circuit (IC) die 102 (also generally referred to as a first IC die) and at least one secondary IC die 104 (also generally referred to as at least one additional IC die). By way of example, two secondary IC dice 104 are shown in FIG. 1. The primary IC die 102 includes circuitry formed on a semiconductor substrate and conductive interconnect formed over the circuitry (not shown). Likewise, each secondary IC die 104 includes circuitry formed on a semiconductor substrate and conductive interconnect formed over the circuitry (not shown). The primary IC die 102 and each secondary IC die 104 may be fabricated using well known IC fabrication techniques. The primary and secondary IC dice 102 and 104 may comprise any type of digital, analog, or mixed-signal ICs.

The semiconductor device 101 is mounted on the package substrate 116 via an array of bump contacts 114. Notably, the array of bump contacts 114 is formed on a face side of the primary IC die 102. As discussed above, the term "face side" denotes the side of a die that receives the bulk of semiconductor processing such that circuitry is fabricated on that face side of the die. The side of a die opposite the face side is referred to as the backside of the die. The bump contacts 114 form an electrical and mechanical connection between the primary IC die 102 and the package substrate 116. The package substrate 116 may comprise any type of carrier capable of supporting the semiconductor device 101, such as a printed circuit board (PCB) or the like. Thus, in the embodiment of FIG. 1, the primary IC die 102 is mounted face-down on the package substrate 116 in flip-chip fashion.

Each secondary IC die 104 is mounted on the primary IC die 102 such that the secondary IC die 104 is vertically stacked with the primary IC die 102. In the present embodiment, each secondary IC die 104 is mounted to the backside of the primary IC die 102. In general, the surface of the primary IC die 102 upon which the secondary IC die 104 is mounted is referred to as the first surface of the primary IC die 102. Each secondary IC die 104 is mounted on the primary IC die 102 via bump contacts 112. The bump contacts 112 form an electrical and mechanical connection between each secondary IC die 104 and the primary IC die 102. In the present embodiment, each secondary IC die 104 is mounted face-down in flip-chip fashion. Those skilled in the art will appreciate that one or more of the secondary dice 104 may be mounted face-up in conventional fashion. As is well known in the art, in case of face-up mounting, the bump contacts 112 are typically replaced with wire bonds extending between the face side of the secondary die 104 and the backside of the primary die 102.

The semiconductor device 101 includes a mounting surface 118 configured for thermal contact with the heat extraction element 110. In the present embodiment, the heat extraction element 110 is shown as a heat sink having a base 109 and a plurality of fins 111. Those skilled in the art will appreciate that such a heat sink is merely exemplary and may have other well-known configurations. Furthermore, while a heat sink is shown by way of example, it is to be understood that the heat extraction element 110 may comprise other types of elements or combinations of elements, including heat sinks, heat pipes, and/or active cooling devices (e.g., air coolers, liquid coolers, etc.). In general, the heat extraction element 110 has a base (e.g., the base 109) capable of thermal contact with the mounting surface 118 of the semiconductor device 101. Such thermal contact may include a layer of thermal paste (not shown), such as is well-known in the art.

Each secondary IC die 104 includes opposing top and bottom surfaces. In the present embodiment, the bottom surface is the face side of the secondary IC die 104, and the top surface is the backside of the secondary IC die 104. In embodiments where the secondary IC dice 104 are mounted face-up, the top and bottom surfaces are reversed, i.e., the top surface is the face side and the bottom surface is the backside.

In accordance with one aspect of the invention, the semiconductor assembly 100 includes at least one dummy fill 106. By way of example, three dummy fills 106 are shown in FIG. 1. Each dummy fill 106 includes opposing top and bottom surfaces. The bottom surface of each dummy fill 106 is mounted to the backside of the primary IC die 102. The dummy fill(s) 106 is/are adjacent the secondary IC die 104. Notably, the primary IC die 102 includes a surface area footprint defined by the surface area of the backside thereof (generally referred to as the first surface area). Likewise, each secondary IC die 104 includes a surface area footprint defined by the surface area of the bottom surface thereof. Collectively, the secondary IC die 104 provide an aggregate surface area footprint. As shown, the aggregate surface area footprint of the secondary IC dice 104 is less than the surface area footprint of the primary IC die 102. That is, the secondary IC dice 104 are mounted in a portion of the surface area of the bottom surface of the primary IC die 102. The dummy fill(s) 106 is/are mounted in a second portion of the surface area of the bottom surface of the primary IC die 102. That is, the dummy fill(s) 106 is/are mounted within a portion of the surface area footprint of the primary IC die 102 that is not occupied by the secondary IC dice 104. Notably, the dummy fill(s) do not necessarily occupy the remainder of the surface area footprint of the primary IC die 102. In other words, there may be some spacing between the secondary IC dice 104 and the dummy fills 106, as shown in FIG. 1. The dummy fill(s) 106 can be formed of silicon and/or of some other material, such as a metallic substance.

The height of the dummy fill(s) 106 and the secondary IC dice 104 (i.e., the distance between top and bottom surfaces) are substantially the same. In this manner, the top surfaces of the dummy fill(s) 106 and the secondary IC dice 104 form the mounting surface 118. That is, the heat extraction element 110 is in thermal contact with the top surfaces of the dummy fill(s) 106 and the secondary IC dice 104. For example, the heat extraction element 110 may be mounted to such top surfaces using a thermal paste.

The dummy fill(s) 106 and the secondary IC dice 104 thermally couple the primary IC die 102 to the heat extraction element 110. In particular, the dummy fill(s) 106 provide direct thermal conduction path(s) from the primary IC die 102 to the base 109 of the heat extraction element 110. In addition, the dummy fill(s) 106 reduce thermal spreading resistance between: (1) the interface between the secondary IC dice 104 and the heat extraction element 110; and (2) the interface between the primary IC die 102 and the secondary IC dice 104. In other words, the dummy fill(s) 106 reduce junction-to-package thermal resistance in die stacking applications, as compared to semiconductor devices without such dummy fill(s) 106.

The dummy fill(s) 106, the secondary IC dice 104, and the primary IC die 102 may be encapsulated by a mold compound 108. The mold compound 108 may comprise any type of molding compound known in the art used to package ICs. In some embodiments, the mold compound 108 comprises a cured polymer resin-based material, thermoplastic material, thermoset material, or the like. The mold compound 108 may be filled with the dummy fill(s) 106.

In some embodiments, the dummy fill(s) 106 comprise a high thermal conductivity material, such as silicon or like type materials having a thermal conductivity greater than or equal to silicon, including metallic fills (e.g., copper, aluminum, etc.). In specific non-limiting embodiments, the dummy fill(s) 106 comprise dummy silicon fills. In one example, the dummy silicon fills do not have any active or passive components formed thereon. Such dummy silicon fills do not require the expense of fabricating circuitry and conductive interconnect and thus may be manufactured using a lower cost manufacturing process. For example, the dummy silicon fills can be manufactured and diced from lower cost wafers as compared to the wafers used for the IC dice (e.g., 6 inch or 8 inch wafers for dummy silicon fills versus 12 inch wafers for IC dice).

Figure 2:
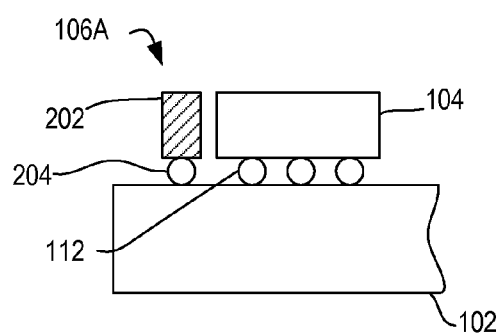
FIG. 2 is a cross-sectional view showing an exemplary embodiment of a portion of a semiconductor device in accordance with one or more aspects of the invention.

FIG. 2 is a cross-sectional view showing an exemplary embodiment of a portion of the semiconductor device 101 in accordance with one or more aspects of the invention. In FIG. 2, a part of the primary IC die 102 is shown with a secondary IC die 104 and a dummy fill 106A mounted thereon (one of the dummy fill(s) 106). In the present embodiment, the dummy fill 106A is a dummy silicon fill having a silicon substrate 202 and a thermal contact 204. The thermal contact 204 may comprise, for example, at least one bump contact or the like. A thermal conduction path is established from the primary IC die 102 to the silicon substrate 202 via the thermal contact 204 and eventually to the heat extraction element 110. Other dummy silicon fills may be configured similarly for the remaining portion of the semiconductor device 101.

Figure 3:
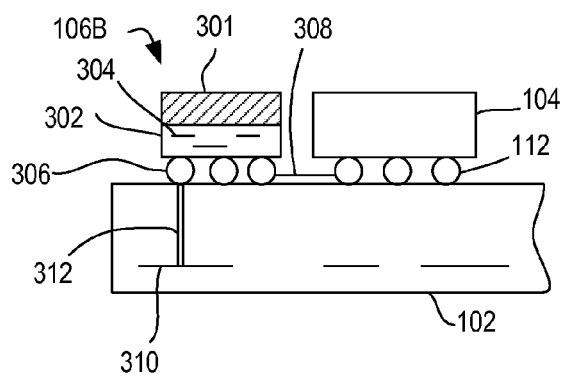
FIG. 3 is a cross-sectional view showing another exemplary embodiment of a portion of a semiconductor device in accordance with one or more aspects of the invention.

FIG. 3 is a cross-sectional view showing another exemplary embodiment of a portion of the semiconductor device 101 in accordance with one or more aspects of the invention. In FIG. 3, a part of the primary IC die 102 is shown with a secondary IC die 104 and a dummy fill 106B mounted thereon (one of the dummy fill(s) 106). In the present embodiment, the dummy fill 106B is a dummy silicon fill having a silicon substrate 301. The silicon substrate 301 includes at least one passive component fabricated thereon. Such a dummy silicon fill is generally referred to as a specialized dummy silicon fill. In some embodiments, circuitry may be formed in the silicon substrate 301 (not shown). A layer of conductive interconnect 302 may also be formed on the silicon substrate 301. The conductive interconnect 302 and/or circuitry may be configured to form one or more passive components 304, such as resistors, capacitors, inductors, or any combination thereof. These components can be used to facilitate RF/mixed signal integration, or to act as decoupling capacitors, for example.

The dummy fill 106B is mounted on the primary IC die 102 via contacts 306. The contacts 306 provide a thermal contact between the primary IC die 102 and the dummy fill 106B. In addition, the contacts 306 may provide for electrical communication between the passive component(s) 304 and circuitry in the primary IC die 102. For example, the primary IC die 102 may include one or more through die vias (TDVs) 312 coupled to conductive interconnect 310 on the face side of the primary IC die 102, thereby providing a path between the passive component(s) 304 and circuitry on the primary substrate 102. The contacts 306 may also provide for electrical communication between the passive component(s) 304 and circuitry in the secondary IC die 104. For example, one or more conductors 308 may be formed on the backside of the primary IC die 102 between the contacts 306 and the bump contacts 112 of the secondary IC die 104. Other dummy silicon fills may be configured similarly for the remaining portion of the semiconductor device 101.

The passive component(s) 304 may be used for various purposes. For example, the passive component(s) 304 may be used for mixed-signal circuits. Capacitors may be formed in silicon fills to implement de-coupling capacitors for a power distribution network. Unlike off-chip capacitors, which are connected to the package substrate 116 through bond-wires or solder balls, the de-coupling capacitors in the dummy silicon fills are attached directly to the active device. As a result, they have less parasitic resistance and provide superior performance as compared to off-chip capacitors. Those skilled in the art will appreciate that the passive component(s) 304 may be used for a myriad of other purposes.

Figure 4:
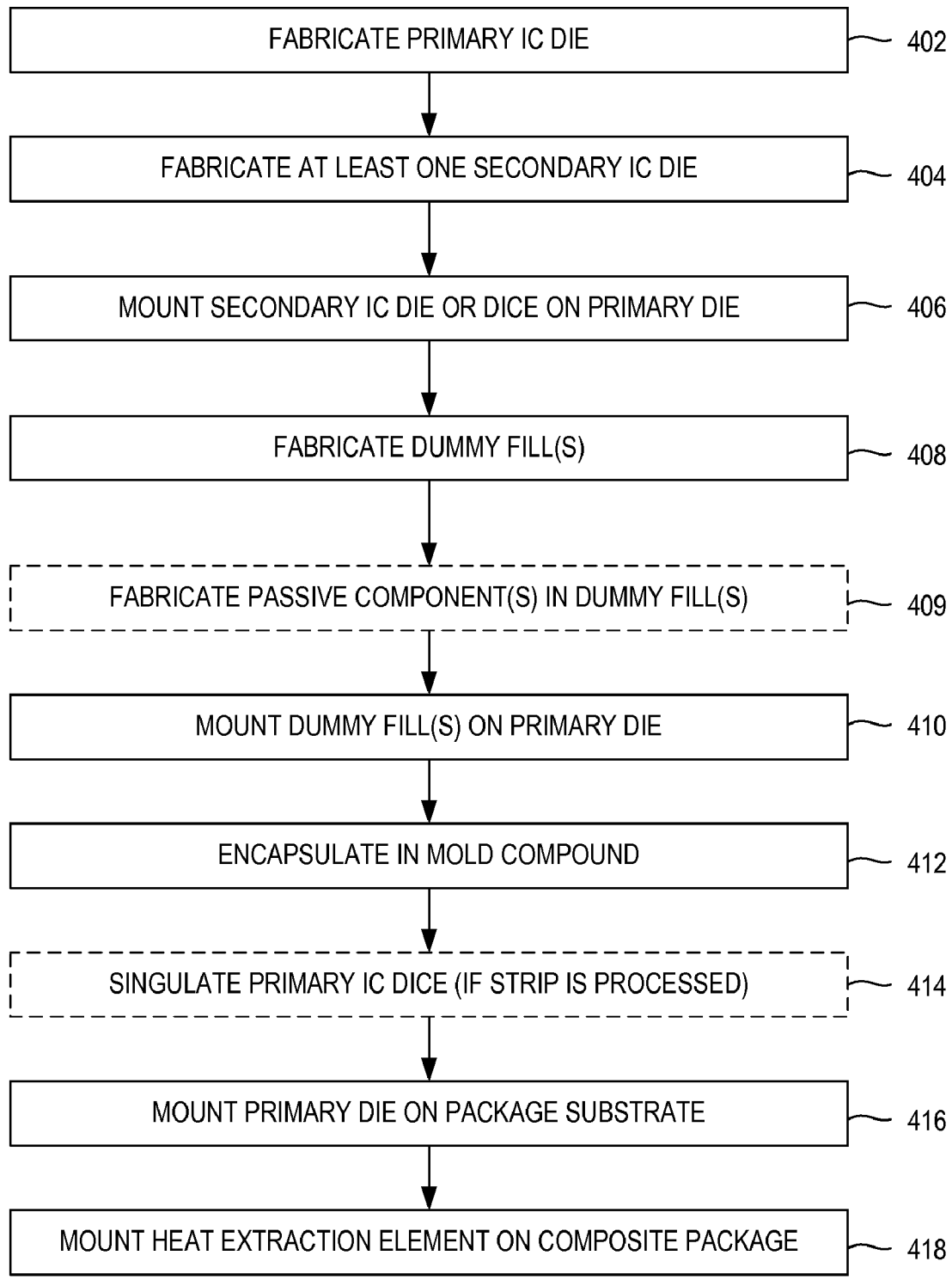
FIG. 4 is a flow diagram depicting an exemplary embodiment of a process of fabricating a semiconductor assembly in accordance with one or more aspects of the invention.

FIG. 4 is a flow diagram depicting an exemplary embodiment of a process 400 of fabricating a semiconductor assembly in accordance with one or more aspects of the invention. The process 400 begins at step 402, where a primary IC die is fabricated using well known IC fabrication techniques. In particular, during IC fabrication, a wafer of primary IC dice is produced. The wafer may be scored and strips of a plurality of primary IC dice obtained. Although step 402 is broadly described in terms of a single primary IC die, it is to be understood that multiple primary IC dice may be produced and processed in parallel using the method 400. That is, the steps of processing a single primary IC die can be extended to process multiple primary IC dice. For example, the primary IC dice may be processed in the steps below a strip at a time.

At step 404, at least one secondary IC die is fabricated for the primary IC die (or for each of the primary IC dice in a strip). The secondary IC die or dice may be fabricated using similar IC fabrication techniques to the primary IC die. The secondary IC die or dice may be singulated from wafer(s) after manufacture. At step 406, the secondary IC die or dice are mounted on the primary IC die (or on each of the primary IC dice in a strip). As described above, the bottom surface of a secondary IC die is mounted to the backside of a primary IC die. At step 408, at least one dummy fill is fabricated for the primary IC die (or for each of the primary IC dice in a strip). At optional step 409, at least one passive component is fabricated on each of the dummy fill(s).

At step 410, the dummy fill(s) is/are mounted on the primary IC die (on each of the primary IC dice in a strip). As described above, the bottom surface of a dummy fill is mounted to the backside of a primary IC die. At step 412, the primary IC die (or strip of primary IC dice) is encapsulated with a mold compound. As described above, the mold compound encapsulates the primary IC die, the secondary IC die or dice, and the dummy fill(s) to produce a composite package. At optional step 414, if a strip of primary IC dice is being processed, then the primary IC dice may be singulated to produce individual composite packages. At step 416, the primary IC die (or primary IC dice) may be mounted to a package substrate (or multiple package substrates). At step 418, a heat extraction element may be mounted to the composite package (or each of the composite packages).

While the foregoing describes exemplary embodiments in accordance with one or more aspects of the present invention, other and further embodiments in accordance with the one or more aspects of the present invention may be devised without departing from the scope thereof, which is determined by the claims that follow and equivalents thereof. Claims listing steps do not imply any order of the steps. Trademarks are the property of their respective owners.

What is claimed is:
1. A semiconductor device, comprising:
a first integrated circuit (IC) die having a first surface;
at least one additional IC die each having a top surface and a bottom surface, the bottom surface of each of the at least one additional IC die being mounted to the first surface of the first IC die;

at least one dummy fill each separate from the at least one additional IC die and having a top surface and a bottom surface, the bottom surface of each of the at least one dummy fill being mounted to the first surface of the first IC die adjacent the at least one additional IC die;

a heat extraction element extending along and in physical contact with the entire top surface of the at least one additional IC die and the top surface of the at least one dummy fill; and a mounting surface that has direct contact with a bottom surface of the heat extraction element, the mounting surface including the entire top surface of each of the at least one additional IC die and the top surface of the at least one dummy fill, wherein the physical contact of both the entire top surface of the at least one additional IC die and the top surface of the at least one dummy fill enables the thermal coupling of the first IC die to the heat extraction element, wherein the at least one dummy fill provides a direct thermal conductive path from the first IC die to the heat extraction element, and wherein the at least one dummy fill and the at least one additional IC die are encapsulated by a mold compound.

2. The semiconductor device of claim 1, wherein the first surface has a first surface area, and wherein each of the at least one additional IC die is mounted in a first portion of the first surface area and the at least one dummy fill is mounted in a second portion of the first surface area.

3. The semiconductor device of claim 1, wherein the at least one dummy fill includes at least one dummy silicon fill.

4. The semiconductor device of claim 3, wherein the at least one dummy silicon fill includes at least one specialized dummy silicon fill each having at least one passive component fabricated thereon.

5. The semiconductor device of claim 4, wherein the at least one passive component of each of the at least one specialized dummy silicon fill includes at least one of a resistor, a capacitor, or an inductor.

6. The semiconductor device of claim 1, wherein the mold compound encapsulates the first IC die.

7. The semiconductor device of claim 1, wherein the first IC die includes a backside opposing a face side, and wherein the first surface comprises the backside.

8. A method of fabricating a semiconductor device, comprising:

fabricating a first integrated circuit (IC) die having a first surface;

fabricating at least one additional IC die each having a top surface and a bottom surface;

mounting the bottom surface of each of the at least one additional IC die to the first surface of the first IC die;

fabricating at least one dummy fill each having a top surface and a bottom surface;

mounting the bottom surface of each of the at least one dummy fill to the first surface of the first IC die separate from and adjacent the at least one additional IC die;

mounting a bottom surface of a heat extraction element to the entire top surface of each of the at least one additional IC die and the top surface of the at least one dummy fill, the heat extraction element extending along and in physical contact with the entire top surface of each of the at least one additional IC die and the top surface of the at least one dummy fill, wherein the physical contact with both the entire top surface of each of the at least one additional IC die and the top surface of the at least one dummy fill enables the thermal coupling of the first IC die to the heat extraction element, and wherein the at least one dummy fill provides a direct thermal conductive path from the first IC die to the heat extraction element; and encapsulating the at least one additional IC die and the at least one dummy fill using a mold compound.

9. The method of claim 8, wherein the first surface has a first surface area, and wherein each of the at least one additional IC die is mounted in a first portion of the first surface area and the at least one dummy fill is mounted in a second portion of the first surface area.

10. The method of claim 8, wherein the at least one dummy fill includes at least one dummy silicon fill.

11. The method of claim 10, wherein the fabricating the at least one dummy fill comprises:

forming at least one passive component on the at least one dummy silicon fill.

12. The method of claim 11, wherein the at least one passive component includes at least one of a resistor, a capacitor, or an inductor.

13. The method of claim 8, further comprising:

encapsulating the first IC die; and attaching a composite package to a packaging substrate where the composite package is comprised of the first IC die, the at least one additional IC die and the at least one dummy fill.

14. The method of claim 8, wherein the first IC die includes a backside opposing a face side, and wherein the first surface comprises the backside.

15. An semiconductor assembly, comprising:

a semiconductor device including a primary integrated circuit (IC) die and at least one secondary IC die mounted on the primary IC die;

a heat extraction element having a base mounted to the semiconductor device such that each of the at least one secondary IC die is between the primary IC die and the heat extraction element; and at least one dummy fill each separate from and adjacent the at least one secondary IC die and each thermally coupling the primary IC die to the heat extraction element, wherein the heat extraction element extends along and is in physical contact with an entire top surface of each of the at least one secondary IC die and the top surface of the at least one dummy fill such that the physical contact of both the entire top surface of each of the at least one secondary IC die and the top surface of the at least one dummy fill enables the thermal coupling of the first IC die to the heat extraction element; and wherein the top surface of the at least one dummy fill is directly coupled to a bottom surface of the heat extraction element to provide a direct thermal conductive path from the primary IC die to the heat extraction element, and wherein the at least one dummy fill and the at least one secondary IC die are encapsulated by a mold compound.

16. The semiconductor assembly of claim 15, wherein the at least one secondary IC die have an aggregate surface area footprint less than a surface area footprint of the primary IC die, and wherein at least one dummy fill is mounted to the primary IC die within a portion of the surface area footprint thereof that is not occupied by the at least one secondary IC die.

17. The semiconductor assembly of claim 15, wherein the at least one dummy fill includes at least one dummy silicon fill.

18. The semiconductor assembly of claim 17, wherein the at least one dummy silicon fill includes at least one specialized dummy silicon fill each having at least one passive component fabricated thereon.

19. The semiconductor assembly of claim 15, wherein:
the mold compound encapsulates the primary IC die; and
further comprising
a package substrate supporting the semiconductor device.

20. The semiconductor assembly of claim 15, wherein the primary IC die includes a backside opposing a face side, and wherein each of the at least one secondary IC and each of the at least one dummy fill is mounted to the backside.

* * * * *